United States Patent
Maleville et al.

(10) Patent No.: US 7,285,471 B2
(45) Date of Patent: Oct. 23, 2007

(54) PROCESS FOR TRANSFER OF A THIN LAYER FORMED IN A SUBSTRATE WITH VACANCY CLUSTERS

(75) Inventors: Christophe Maleville, La Terrasse (FR); Eric Neyret, Sassenage (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 138 days.

(21) Appl. No.: 11/128,560

(22) Filed: May 13, 2005

(65) Prior Publication Data

US 2006/0172508 A1 Aug. 3, 2006

(30) Foreign Application Priority Data

Jan. 31, 2005 (FR) .................................. 05 00936

(51) Int. Cl.
*H01L 21/331* (2006.01)
*H01L 21/8222* (2006.01)

(52) U.S. Cl. .................. 438/311; 438/459; 438/513; 438/663; 257/E21.32; 257/E21.311; 257/E21.324; 257/E21.561

(58) Field of Classification Search ........... 438/311, 438/318, 474, 475, 479, 485, 488, 513, 663, 438/459, 680
See application file for complete search history.

(56) References Cited

U.S. PATENT DOCUMENTS 5,935,320 A 8/1999 Graef et al. ................ 117/2

(Continued)

FOREIGN PATENT DOCUMENTS

EP 0 955 671 A1 11/1999

(Continued)

OTHER PUBLICATIONS

Vasat, J.L. et al., "A Novel Method for Achieving Very Low Cops in CZ Wafers", MEMC Electronic Materials Inc., unknown date.

(Continued)

*Primary Examiner*—David Nhu
(74) *Attorney, Agent, or Firm*—Winston & Strawn LLP

(57) ABSTRACT

Processes for forming semiconductor structure comprising a transfer layer transferred from a donor substrate are provided in which the resulting structure has improved quality with respect to defects and resulting structures therefrom. For example, a semiconductor on insulator ("SeOI") structure can be formed using a donor substrate, a support substrate and an insulating layer. The donor substrate may be formed using CZ pulling of semiconductor material at a rate that results in the existence of vacancy clusters. An insulating layer for the SeOI structure can be formed by depositing an oxide layer on the donor or support substrate. An insulating layer can also be formed by thermal oxidizing the support substrate. An SeOI structure can be formed by combining the donor substrate, the support substrate, and the insulating layer there between, and detaching the combination including a thin layer of the donor substrate using a zone of weakness that was formed in the donor substrate. In some embodiments, the donor substrate is initially formed using a technique that results in lower COPs quality or density that if the donor substrate was formed from a Very Slow Pull, and after curing of the thin layer formed therefrom, results in a structure having COPs quality or density that is better than a near perfect crystalline structure.

22 Claims, 1 Drawing Sheet

PULLING SPEED

U.S. PATENT DOCUMENTS

| | | | |
|---|---|---|---|
| 5,953,622 A | 9/1999 | Lee et al. | 438/458 |
| 6,236,104 B1 | 5/2001 | Falster | 257/618 |
| 6,245,430 B1 | 6/2001 | Hourai et al. | 428/450 |
| 6,284,628 B1 | 9/2001 | Kuwahara et al. | 438/459 |
| 6,342,725 B2 | 1/2002 | Falster | 257/618 |
| 6,380,046 B1 | 4/2002 | Yamazaki | 438/409 |
| 6,387,829 B1 * | 5/2002 | Usenko et al. | 438/977 |
| 6,613,678 B1 | 9/2003 | Sakaguchi et al. | 438/695 |
| 6,617,034 B1 | 9/2003 | Hamaguchi et al. | 428/446 |
| 6,743,495 B2 * | 6/2004 | Vasat et al. | 428/64.1 |
| 6,843,847 B1 | 1/2005 | Iida et al. | 117/13 |
| 6,846,718 B1 | 1/2005 | Aga et al. | 438/406 |
| 6,995,075 B1 * | 2/2006 | Usenko | 438/458 |
| 7,148,124 B1 * | 12/2006 | Usenko | 438/458 |
| 2002/0157598 A1 | 10/2002 | Hoshi et al. | |
| 2003/0203657 A1 | 10/2003 | Ito | 438/795 |
| 2004/0040491 A1 | 3/2004 | Murakami et al. | 117/20 |
| 2004/0060900 A1 | 4/2004 | Waldhauer et al. | |
| 2004/0195656 A1 | 10/2004 | Ghyselen et al. | 257/616 |
| 2005/0032331 A1 | 2/2005 | Nakano | 438/459 |
| 2005/0042840 A1 | 2/2005 | Aga et al. | 438/458 |
| 2005/0067294 A1 | 3/2005 | Choe et al. | 205/157 |

FOREIGN PATENT DOCUMENTS

| | | |
|---|---|---|
| EP | 0 961 312 A2 | 12/1999 |
| EP | 0 969 505 A2 | 1/2000 |
| WO | WO 2004/044278 A1 | 5/2004 |
| WO | WO 2004/066390 A1 | 8/2004 |

OTHER PUBLICATIONS von Ammon, W. et al., 1998, "Si melt Growth: Grown-in Defects and Simulation of their Formation".

Yang, Deren, "Grown-in Defects in Nitrogen-doped Czochralski Silicon", State Key Lab of Silicon Materials, unknown date.

Colinge, J.P., 1997, "Silicon-On-Insulator Technology", Materials to VLSI, 2nd Edition, pp. 50-51.

* cited by examiner

PROCESS FOR TRANSFER OF A THIN LAYER FORMED IN A SUBSTRATE WITH VACANCY CLUSTERS

BACKGROUND OF THE INVENTION

The general field is in the field of semiconductor processes and materials. The particular fields of application relates to semiconductor-on-insulator materials and improvements in the processing speed, efficiency, and quality of semiconductor structures.

The present invention relates to processes for forming structures by transferring of a thin layer of semiconducting material from a donor substrate to a support substrate. One field of application is in the field of semiconductor on insulator (SeOI) structures, for example silicon on insulator (SOI) structures, that provide structures acting as substrates for electronics, optics and optoelectronics. SeOI structures are formed to include an insulating layer inserted between a thin layer made of a semiconducting material and a support substrate. SMARTCUT® type processes are an example of a process of this type. These processes correspond to at least some embodiments of the present invention. Further details about the SMARTCUT® process are given in the "Silicon-On-Insulator Technology: Materials to VLSI, $2^{nd}$ Edition" document by Jean-Pierre Colinge published by "Kluwer Academic Publishers", p. 50 and 51.

Production of an SeOI structure using the SMARTCUT® process and particularly an SeOI structure in which the thin layer is particularly thin (typically less than 400 nm) requires the use of an initial donor substrate without any growth defects in the form of vacancy clusters (known as Crystal Originated Particles or COPs). The presence of vacancy clusters in the volume of the donor substrate may generate defects for which the size is larger than the thickness of the thin layer of the final SeOI structure. These resulting "through" defects are fatal defects because a component formed in a portion of the SeOI structure that includes one of these defects will not be operable. The presence of these through defects is therefore a parameter that controls the quality of components that will be created on the final structure. Therefore, it is essential to minimize the presence of these through defects. Obviously, it will be understood that the problem of such defects is particularly important if the thickness of the thin layer is "thin" such that the size of vacancy clusters are significant in comparison to the thickness of the layer.

One solution for limiting the number of through defects in an SeOI substrate and that has been frequently used in the past is to use an initial substrate with a very high crystallographic quality and having a low density of COPs. An initial substrate is typically formed by cutting into an ingot obtained by the CZ process (Czochralski pulling). Control over the pulling speed and the ingot-cooling rate provides a means for reducing the quantity of vacancy cluster type defects. Thus, an initial substrate with almost no COPs is typically formed by cutting an ingot obtained by the CZ (Czochralski pulling) process using very specific pulling conditions and in particular, using very slow pulling (pulling also designated by the name "Very Slow Pull" to obtain what those skilled in the art call a Near Perfect Crystal due to the very low number of defects).

Substrates formed by cutting an ingot obtained by simpler and/or faster pulling processes have comparatively more vacancy clusters and are therefore considered to be incompatible with the constraints imposed in target application fields (such as optics, electronics or optoelectronics). For example, a substrate formed by cutting a Near Perfect Crystal obtained by a "Very Slow Pull" type pulling at a rate of less than 0.5 mm/min will typically have a density of COPs (larger than 0.1 μm) between 0.045 and 0.075 COPs/$cm^2$ (equivalent to 30 to 50 COPs larger than 0.1 μm in a 300 mm diameter wafer with a surface area of 660 $cm^2$ allowing for a 5 mm exclusion area around the wafer). Comparatively, a substrate obtained using standard pulling at a rate 1.2 to 1.5 times faster than the "Very Slow Pull" type pulling, will have a density of COPs (larger than 0.1 μm) between 1.5 and 4.5 COPs/$cm^2$ (equivalent to 1000 to 3000 COPs larger than 0.1 μm in a 300 mm diameter wafer).

It will be noted that the ingot-cooling rate during pulling is another factor that will influence its crystallographic quality. Information about this subject is given in chapter 1.6 "Si MELT GROWTH: GROWN-IN DEFECTS AND SIMULATION OF THEIR FORMATION" by W. von Ammon and E. Dornberger, pages 39-51 in the "Properties of Crystalline Silicon" document published by Robert Hull in INSPEC publications (January 1998) that demonstrates that a high cooling rate (pulling designated as "Fast Cool") is accompanied by an increase in the density of defects. Therefore a substrate obtained by cutting an ingot obtained by "Fast Cool" type pulling is also incompatible with imposed constraints in the application fields of the present invention.

The production efficiency for a quality substrate (Near Perfect Crystal with almost no COPs by means of a CZ "Very Slow Pull" type pulling) is significantly lower than the production efficiency of substrates using simpler and/or faster pulling processes. Therefore the production of a near perfect substrate by "Very Slow Pull" type pulling is particularly expensive; its cost is thus typically 30% greater than the cost of substrates obtained by standard CZ pulling. It will be noted that it has also been proposed to use a previously heat treated standard substrate to reduce the quantity of COPs, as an initial substrate in a process for making an SOI structure. Further information about this subject is given for example in the article "A NOVEL METHOD FOR ACHIEVING VERY LOW COPS IN CZ WAFERS" by J. L. Vasat and T. Torack, published in the March 2003 issue of the Solid State Technology journal. However, the use of such a previous heat treatment is not satisfactory. This treatment modifies the surface properties of the initial substrate (and in particular increases its surface roughness) such that problems can occur during bonding of the initial substrate to a support substrate (and particularly degradation of the bonding quality). Furthermore, this previous heat treatment can generate "slip line" type defects or oxygen precipitates that could compromise recycling of the initial substrate that is usually used in a SMARTCUT® type process.

Therefore, it would be beneficial to provide improved processes, at least, for example, for forming semiconductor-on-insulator structures having improved defect characteristics and processing efficiencies.

SUMMARY OF THE INVENTION

In accordance with the principles of the present invention, methods for forming semiconductor structures having improved vacancy cluster characteristics, and structure resulting from the methods are provided.

A method for forming a semiconductor on insulator structure can be provided, for example, in which a donor substrate having a first density of vacancy clusters is provided; an insulating layer is provided either on a surface of the donor substrate or on a surface of a support substrate, wherein, when the insulating layer is provided on the donor substrate surface, it is done in a manner to not increase vacancy cluster size; a thin layer is transferred from the donor substrate to the support substrate with the insulating layer provided therebetween; and the transferred thin layer is cured to reduce the first density of vacancy clusters to a second density of vacancy clusters.

If desired, the insulating layer can be provided by thermal oxidizing of the support substrate surface. The insulating layer can also be provided by depositing an oxide layer either on the donor or support substrate surface. A combination of techniques may also be used as long as the process does not impact the defect characteristics of the thin layer.

Curing of the transferred thin layer can include applying a thermal annealing to the structure wherein the annealing is performed immediately after transferring the thin layer. The thermal annealing can be a rapid thermal processing (RTP) performed under a non-oxidizing atmosphere. In some embodiments, the annealing is performed in a furnace under an atmosphere containing pure hydrogen, pure argon or a mixture of hydrogen and argon. The annealing can be a smoothing annealing performed under an atmosphere containing hydrogen and hydrochloric acid.

To form the donor substrate, an ingot of semiconductor material is preferably used that was formed by a pulling rate higher that a Very Slow Pull such as at a rate of at least 0.75 mm/min.

In some embodiments, the ingot is subjected to cooling at a sufficiently fast rate to reduce vacancy size and to increase vacancy density. Nitrogen doping can also be used to reduce vacancy size and to increase vacancy density.

A zone weakness in the donor substrate can be formed to define the thin layer to be transferred. After the donor wafer, insulating layer and support substrate are combined the zone of weakness can be used to detach the thin layer from the donor substrate as part of the combined structure.

Such methods, for example, include providing a protective layer on the donor substrate, implanting atomic species to form the zone of weakness, and optionally removing the protective layer after implanting the atomic species.

In one particular embodiment, the method comprises nitrogen doping a donor substrate to reduce vacancy clusters therein (e.g., doping when the substrate is being formed), providing an insulating layer, transferring a thin layer of the donor substrate to a support substrate with the insulator layer provided thereon by providing a zone of weakness in the donor substrate to define the thin layer to be transferred and detaching the thin layer from the donor substrate, and curing the transferred thin layer to reduce vacancy clusters therein. The insulating layer can be formed by depositing an oxide layer on the donor substrate and implanting atomic species in the donor substrate through the oxide layer to create the zone of weakness within the donor substrate, so that the oxide layer and thin layer are transferred together to the support substrate.

In some embodiments, the insulating layer is formed by depositing an oxide layer on the support substrate, and transferring the thin layer onto the oxide layer. In other embodiments, the insulating layer is formed by thermal oxidation of the support substrate so that the thin layer is transferred onto the insulating layer.

In some embodiments, nitrogen doping is preferably conducted while pulling the donor substrate from an ingot at a rate that is greater than 0.75 mm/min.

A resultant structure from such methods can for example be a semiconductor on insulator structure comprising an insulating layer located between a thin layer of semiconductor material and a support substrate, wherein the thin layer has a density of vacancy clusters of less than or equal to approximately $0.075/cm^2$.

As such, the present invention relates to processes for providing a structure comprising a thin layer of semiconducting material and a support substrate, involving the transfer of the thin layer from a donor substrate with vacancy clusters to the support substrate, which, for example, includes: curing the vacancy clusters present in the thin layer after the thin layer is transferred onto the support substrate, and performing one or more steps adapted so as not to increase the size of the vacancy clusters present in said thin layer which are performed prior to the curing step. The present invention also relates to an SeOI structure obtained by this process, and also a process for recycling a substrate with vacancy clusters which had been used as a donor substrate from which a thin layer was taken and transferred onto a support substrate. The recycling process, for example, includes one or more steps adapted so as not to increase the size of the vacancy clusters present in said substrate.

According to another aspect, the present invention relates to a semiconductor on insulator substrate including an insulating layer inserted between a thin layer of semiconducting material and a support substrate obtained using the processes of the present invention, and particularly an SeOI substrate obtained from a donor substrate with a density of vacancy clusters equal to approximately $3/cm^2$, wherein the thin layer finally comprises a density of vacancy clusters equal to or less than approximately $0.075/cm^2$.

In some embodiments, the curing step is performed immediately after transfer of the thin layer from the donor substrate (e.g., without first cleaning the surface of the thin layer).

In some embodiments, the donor substrate is a substrate formed by cutting an ingot of said semiconducting material obtained by pulling that creates vacancy clusters with an average size less than the size of clusters present in a near perfect substrate formed by cutting an ingot obtained by slow pulling. For example, in some embodiments, the donor substrate is formed by cutting an ingot obtained by CZ pulling such that the density of clusters of created vacancies larger than 0.14 μm is less than $0.01/cm^2$. Further, in some embodiments, the donor substrate is formed by cutting an ingot obtained by CZ pulling such that the density of created clusters of vacancies smaller than 0.2 μm is greater than $1.5/cm^2$ or, for example, such that the density of created clusters of vacancies smaller than 0.12 μm is greater than $3/cm^2$.

In accordance with the principles of the present invention, the donor substrate can be formed by cutting an ingot obtained by a CZ process by pulling at a speed at least 1.2 times greater than the speed of the said slow pulling to obtain a near perfect crystal. Forming the donor substrate can for example include forming the substrate by cutting an ingot subjected to fast cooling.

A zone of weakness can be created within the thickness of the donor substrate without the donor substrate having been previously submitted to a cleaning treatment. Such a step can include depositing an oxide layer on the donor substrate surface to form a protection layer, which can be removed once the zone of weakness has been created.

If desired, the support substrate is obtained in the same way as the donor substrate.

The structure can if desired include a support substrate that has a density of vacancy clusters greater than or equal to approximately $3/cm^2$. Accordingly, if desired, the techniques illustratively described herein can be applied in forming the support substrate.

These and other features of the systems and methods described herein can be more fully understood by referring to the following detailed description and accompanying drawings.

BRIEF DESCRIPTION OF THE DRAWINGS

Features of the invention, its nature, and various advantages will be apparent from the following detailed description, taken in conjunction with the accompanying drawings in which.

DETAILED DESCRIPTION OF THE PREFERRED EMBODIMENTS

Figure 1:
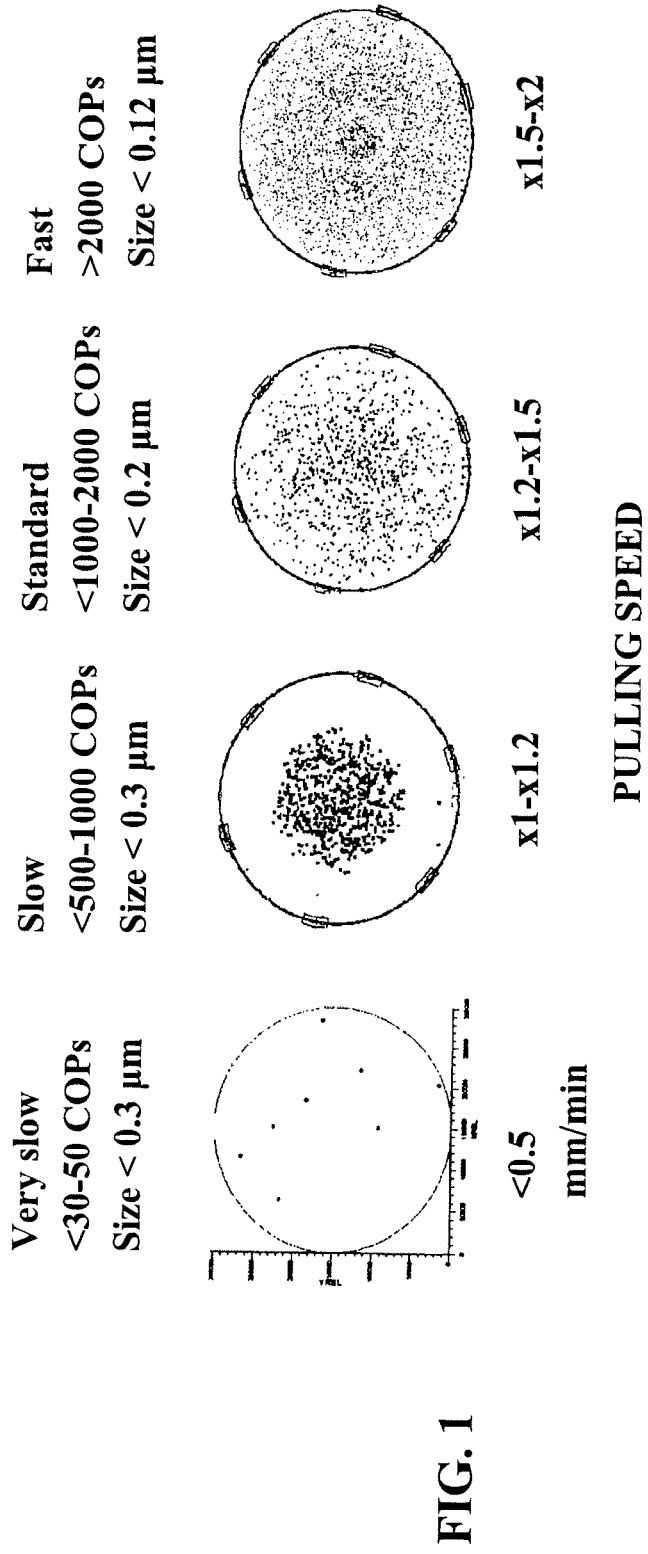
FIG. 1 is an illustrative diagram that shows the variation of the size and density of COPs as a function of the pulling rate of an ingot.

The present invention relates to processes for forming a semiconductor on insulator structure. In some embodiments the invention relates particularly to a SMARTCUT® type transfer process, for which the main steps are mentioned below.

In a SMARTCUT® type transfer process, a donor substrate made of a semiconducting material from which the thin layer is formed is exposed to implantation of species to create a zone of weakness within the thickness of the donor substrate. The face of the donor substrate in which the implantation was made is then brought into intimate contact with a support substrate. The donor substrate is then detached at the level of the weakness zone resulting in part of the donor substrate thus being transferred onto the support substrate to form the thin layer on the support substrate.

When making an SeOI structure, an insulating layer is inserted between the thin layer and the support substrate. In the context of the present invention, the donor substrate is not necessarily formed by cutting an ingot with a near perfect crystal quality ("Near Perfect Crystal") obtained by "Very Slow Pull" type CZ pulling. On the contrary, in the context of one advantageous embodiment of the process according to the invention for transferring a thin layer from a donor substrate to a support substrate, the donor substrate is formed by cutting an ingot of semiconducting material that is obtained by pulling creating vacancy clusters with an average size less than the average size of clusters present in a near perfect substrate formed by cutting an ingot obtained by a slow pulling.

According to one possible embodiment, the process according to the invention comprises a prior step for preparation of the donor substrate includes an operation to make an ingot of semiconducting material by pulling creating vacancy clusters with an average size less than the average size of clusters present in a near perfect crystal obtained by slow pulling, and a step to cut out the donor substrate in this ingot. The pulling mode mentioned above has the advantage that it is not very expensive compared with the "Very Slow Pull" type pulling. For example, this type of pulling mode includes a fast CZ pulling or fast cooling to obtain a crystal commonly called a "Low Defect Crystal" or a crystal called a "Standard Crystal".

According to one advantageous embodiment of the process according to the invention, nitrogen doping can be performed when pulling the ingot from which the donor substrate is obtained. This type of nitrogen doping can facilitate the curing step (which will be described in detail later) so as to remove COPs from the transferred thin layer. For example, information about this subject is given in the article "GROWN-IN DEFECTS IN NITROGEN-DOPED CZROCHRALSKI SILICON" by X. YU, D. YANG, X. MA, J. YANG, L. LI and D. QUE published in July 2002 volume 92, number 1 of the "Journal of Applied Physics" journal, in which it describes that nitrogen doping of the ingot provides a means of generating smaller COPs (admittedly with a greater density), more susceptible to heat treatment. Preferably, the nitrogen doping carried out during pulling of the ingot is adapted to introduce between $10^{14}$ and $5 \times 10^{15}$ atoms of nitrogen/cm$^3$.

According to one advantageous embodiment of the invention, the support substrate is also prepared in the manner described above for the donor substrate, particularly by cutting an ingot formed by standard CZ pulling. The support substrate may also be subjected to nitrogen doping.

With reference to FIG. 1, the Figure shows the variation in the size of COPs and the variation of density of COPs as a function of the pulling rate of an ingot of semiconducting material according to the CZ process. Data about the number of COPs and their size presented in this Figure were obtained using the Surfscan SP1 tool made by the KLA-Tencor Company for laser inspection of wafers, and particularly for counting COPs larger than 0.1 μm within a thickness of up to 5000 Angstroms under the surface of a 300 mm diameter wafer. As is clear in FIG. 1, the density of COPs increases with the pulling rate, while their size reduces with the pulling rate. Thus, a substrate obtained with a very slow pulling rate of less than 0.5 mm/min has a density of COPs with a size between 0.1 μm and 0.3 μm approximately between 0.045 and 0.075 COPs/cm$^2$ (equivalent to 30 to 50 COPs with a size between 0.1 μm and 0.3 μm for a 300 mm diameter wafer). This is a substrate with a near perfect crystallographic quality (Near Perfect Crystal) that is conventionally used to act as a donor substrate in a SMARTCUT® type process. The density of COPs with a size between 0.1 μm and 0.3 μm in a substrate obtained by a "Slow Pull" type pulling speed 1 to 1.2 times greater than the "Very Slow pull" type pulling speed, is approximately between 0.75 and 1.5 COPs/cm$^2$ (equivalent to 500 to 1000 COPs with a size between 0.1 μm and 0.3 μm for a 300 mm diameter wafer). The density of COPs with a size between 0.1 μm and 0.2 μm in a substrate obtained by a "Standard" pulling speed 1 to 1.2 times greater than the "Very Slow Pull" type pulling speed, is approximately between 1.5 and 4.5 COPs/cm$^2$ (equivalent to 1000 to 3000 COPs with a size between 0.1 μm and 0.2 μm for a 300 mm diameter wafer). Finally, the density of COPs with a size between 0.1 μm and 0.12 μm in a substrate obtained by a "Fast Pull" type pulling speed 1.5 to 2 times greater than the "Very Slow Pull" type pulling speed, (i.e., 0.25 to 1 mm/min) is significantly greater than 3 COPs/cm$^2$ (equivalent to more than 2000 COPs with a size between 0.1 μm and 0.12 μm for a 300 mm diameter wafer).

Thus diagrammatically, a substrate cut out in an ingot obtained by standard or fast pulling has a high density of small COPs, while a substrate cut out in an ingot obtained by a slow pulling or a very slow pulling has a low density of large COPs. Thus, controlling the pulling speed provides a means of controlling the size and density of COPs.

In the same way as the control over the pulling speed, control over the ingot cooling rate provides a means of controlling the size and density of COPs. Thus, and as described in the document "Si MELT GROWTH: GROWN-IN DEFECTS AND SIMULATION OF THEIR FORMATION" already mentioned, fast cooling of an ingot reduces the size of defects but increases the density of the defects. Typically, fast cooling relates to cooling of the ingot during which the cooling time between 1100 and 800° C. is reduced.

In the remainder of the description, we will use an example of a pulling creating vacancy clusters with an average size of less than the size of clusters present in a near perfect crystal (for example like that obtained with a "Fast Pull" type pulling). It will be understood that the present invention is not limited to this pulling mode, but can be extended to include any pulling mode, and advantageously to any pulling mode resulting in a substrate with an important number of COPs, but that is more economic than pulling to obtain a near prefect crystal substrate.

Thus, preparation of the support substrate by a CZ "Fast Pull" type pulling, which is significantly less expensive than a "Very Slow Pull" type pulling, provides an initial substrate with a high density of small COPs.

When the donor substrate is made by a fast pulling type CZ process (in opposition to the very slow pulling), and provided that the said donor substrate has not been subjected to a step that could increase the size of the COPs before a transfer of the thin layer, the thin layer will not have any COPs that could generate through defects immediately after transfer onto the support substrate. Due to fast pulling type, the donor substrate will only have small COPs (admittedly with a large density) that are not likely to pass through the entire thickness of the transferred thin layer. However, some operations conventionally performed during a SMART-CUT® type transfer process could increase the size of COPs, thus causing the formation of through defects. For example oxidation, basic cleaning and polishing act on COPs and increase their size, particularly by etching of walls of the COPs in all directions.

When the SMARTCUT® process is used conventionally to make an SeOI type substrate, the donor substrate is typically subjected to thermal oxidation before being exposed to implantation of species to form the insulating layer inserted after transfer between the thin layer and the support substrate (this layer is usually referred to as the buried oxide layer). The donor substrate oxidation step consumes material on the surface of the donor substrate, but also on the walls of COPs. The size of COPs is then increased, by the same order of magnitude as the thickness of oxide produced. Moreover, in its material consumption, the effect of the thermal oxidation is to integrate volume COPs that are then transferred to the surface. Thus, for a conventional embodiment of an SeOI substrate, the size of COPs could increase due to the thermal oxidation before transfer of the donor substrate, thus causing through defects after the transfer. On the other hand, as has already been mentioned, due to the fast pulling that only generates small COPs (or more precisely such that the generated density of COPs larger than about 0.14 µm is less than $0.01/cm^2$, which is equivalent to only a few COPs larger than 0.14 µm for a 300 mm wafer), in the lack of oxidation of the donor substrate before transfer (or more generally the use of any operation that could increase the size of COPs before the transfer), the COPs will usually not be large enough to form a through defect immediately after the transfer.

In the context of making an SeOI substrate according to the invention, and in order to avoid the formation of through defects, the buried insulating layer is not formed conventionally as described above by submitting the donor substrate to thermal oxidation. Thus, before the transfer, the process according to the invention includes a step for formation of the insulating layer adapted so as to not increase the size of vacancy clusters present in the said thin layer.

According to a first possible embodiment, the buried insulating layer is formed by submitting the support substrate rather than the donor substrate to a thermal oxidation.

According to another possible embodiment, the insulating layer is formed by deposition of an oxide layer on the donor substrate and/or on the support substrate.

For example, this type of deposition could be made using the Low Pressure Chemical Vapor Deposition (LPCVD) technique, for example at low temperature and under an atmosphere containing the TEOS (tetraethylorthosilicate $Si(OC_2H_5)_4$) precursor, or at high temperature (High Temperature Oxide HTO) under an atmosphere containing silane and oxygen. This type of deposition could also be made using the Plasma Enhanced Chemical Vapor Deposition (PECVD) technique, that can be used at a lower temperature than the LPCVD technique.

Now returning to the general description of the SMART-CUT® type transfer process according to the preferred embodiment of the invention, the support substrate is exposed to implantation of species adapted to create a weakness zone within its volume. Note that in the case in which an oxide layer is deposited on the donor substrate to form the insulating layer of the final structure, this implantation of species is made through the said oxide layer deposited on the donor substrate. Furthermore, this type of oxide layer deposited on the surface of the donor substrate could act as a protection layer to protect the surface of the donor substrate on which the implantation is made.

According to one possible embodiment, such an oxide layer is thus deposited on the donor substrate before implantation to act as a protection layer, and is then withdrawn after implantation before putting the donor and the support substrates into contact (in this case, the buried insulating layer may then for example be formed by oxidation of the support substrate, or by deposition of a new layer of oxide on the donor substrate).

Preferably, the donor substrate is not subjected to a cleaning step before implantation. As we have already seen (and in the same way as for a thermal oxidation step of a donor substrate formed by fast pulling), this type of cleaning could increase the size of COPs and thus generate through defects.

As a variant to the possible embodiment of the invention described above, other implantation techniques (for example like that presented in International patent application PCT/IB2004003300 filed Sep. 21, 2004, co-implantation of several species, implantation by plasma, which is expressly incorporated herein by reference thereto in its entirety) and/or other thin layer transfer techniques may be used.

Furthermore, the quasi-absence of large COPs (typically larger than about 0.14 µm) provides a means of transferring defect free layers that are thinner than those that can traditionally be transferred (when the donor substrate has large defects). The presence of "through" defects in the thin layer, in other words holes reaching the buried oxide layer, is directly related to the size of COPs in the donor substrate.

Thus, in the context of this invention, implantation parameters may be adjusted so as to transfer layers with a thickness of about 0.15 µm or more.

Returning to the description of a possible embodiment of the invention, the donor and support substrates are then brought into intimate contact, and the donor substrate is then detached at the level of the weakness zone. Part of the donor substrate is then transferred onto the support substrate to form the thin layer on the support substrate.

Bonding can be facilitated by applying a plasma activation treatment to either one or both faces of the substrates brought into contact. This is particularly advantageous if the fracture zone is obtained by co-implantation, which in some cases can make the bonding step more sensitive.

Note that a treatment intended to clean the faces of the donor and the support substrates may be used before bringing the surfaces into intimate contact so as to reinforce the bonding energy. However, such a cleaning treatment is suitable within the context of the invention only to provide reduced etching of treated faces, and therefore only having a limited impact on COPs. Cleaning may be done by an RCA wet cleaning type of chemical surface treatment. The aggressiveness of this RCA treatment may be controlled so that only a small amount of etching is done, for example by monitoring the chemical bath temperature, the exposure time or the product concentration. In particular, it is worth mentioning that the etching rate of faces subjected to a cleaning treatment is limited (a few Angstroms per minute) and in this respect, the cleaning treatment can be adapted to only cause a small amount of etching.

The process according to the invention also comprises a step after the transfer for curing of the vacancy clusters (or COPs) that are present in the transferred thin layer. This curing step is preferably done immediately after the transfer, and in any case preferably before any operation that could increase the size of COPs (for example such as sacrificial oxidation of the thin layer).

According to one possible embodiment, this curing step is performed by carrying out a thermal annealing of the structure obtained after the transfer. This step can cure the thin layer transferred from the donor substrate to the support substrate of the small COPs. COPs present in a layer with a thickness of up to 5 µm can be cured by annealing, for example under a non-oxidizing atmosphere. The high mobility of interstitial atoms present in the volume of the layer then enables reconstruction of the crystal at the COPs which are thus eliminated. For example, this annealing under a non-oxidizing atmosphere (for example under a neutral and/or reducing atmosphere, and particularly under an atmosphere containing argon and/or hydrogen) of the structure obtained after detachment may be a high temperature RTP (Rapid Thermal Processing) annealing according to which the structure obtained after the transfer is heat treated individually, or a thermal annealing performed in a furnace in which different structures are treated in batch.

RTP annealing may be an RTA (Rapid Treatment Annealing) type of annealing done under an atmosphere containing pure hydrogen, pure argon or a hydrogen/argon mix. The annealing temperature is typically between 1050 and 1250° C., and the annealing duration is typically less than 60 seconds. Annealing in the furnace may be done at a temperature between 900° C. and 1200° C. for several hours, under an atmosphere containing pure hydrogen, pure argon or hydrogen/argon mix. Yet another example of thermal annealing is smoothing annealing done under an atmosphere containing hydrogen and hydrochloric acid, for example like that presented in published US patent application US2002/090818, which is expressly incorporated herein by reference thereto in its entirety. This type of smoothing annealing may be an RTA type fast annealing, or of the epitaxy equipment type (duration between a few seconds and a few minutes), the structure obtained after detachment then being treated individually. Smoothing annealing may be done in a furnace (of the order of a few hours), different structures can then be treated in batch.

The thermal budget of this curing by thermal annealing (in other words particularly the annealing duration and temperature) is adapted as a function of the selected annealing type, the size of the COPs (which as we have already seen above depends particularly on the pulling rate and the cooling rate), the thickness of the thin layer and whether or not nitrogen doping is done. It will be noted that the curing annealing is more efficient when the COPs are smaller.

Note also that these annealing operations also have a smoothing effect on the surface of the thin layer (by reconstruction of the crystal on a smooth, non-oxidized surface).

Therefore according to this thermal annealing step, the density of COPs in the thin layer is strongly reduced.

Figure 2:
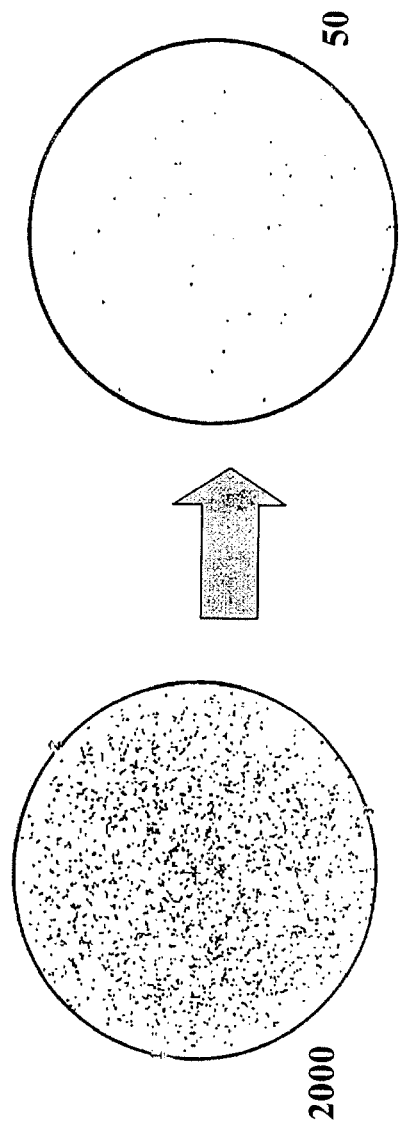
FIG. 2 is an illustrative diagram that shows curing of COPs during implementation of a possible embodiment of the process according to the present invention.

FIG. 2 shows a thin layer transferred to a donor substrate at the left, from an initial substrate of the type obtained by fast pulling and containing about 2000 COPs. After the curing step, the thin layer (shown at the right) only contains about fifty defects (40 times less). Following the COPs curing step, the oxidation, etching and polishing type steps can then be done as is conventionally the case in a SMART-CUT® type transfer process. Note also that the thermal annealing step adapted to cure COPs has a thermal budget such that the said step is also suitable for reinforcing the bonding interface between the thin layer and the support substrate.

One recognized advantage of a SMARTCUT® type transfer process is the possibility of recycling the donor substrate, either to form a new donor substrate from which a new active layer will be formed and transferred, or to make a new support substrate. In the context of this invention, the process may include a treatment step of the donor substrate, after transfer of the thin layer onto the support substrate, adapted to enable recycling of the substrate (in other words reusing it in the transfer process).

According to a first embodiment, this treatment step is adapted to enable recycling of the donor substrate so that it can be used again as a donor substrate. This treatment step restores a surface condition compatible with a new taking off of a thin layer and is done without implementing operations that could increase the size of vacancy clusters present in this substrate. For example, this treatment step may include adapted polishing operations (CMP) and/or cleaning operations, in a similar way as for the pre-bonding cleaning treatment mentioned above, so as to only have a limited impact on COPs, for example by limiting the action of the chemical products used.

According to a second embodiment, the treatment step is adapted to enable recycling of the donor substrate so that it can be used as a support substrate in making a new semiconductor on insulator substrate. In this case, the treatment step is designed to restore a surface condition compatible with molecular bonding (which typically requires a surface roughness less than 5 angstroms RMS). During this recycling treatment step, the amount of material removed within the thickness of the recycled substrate must be limited to less than 10 microns so that the thickness of the final SeOI wafer (after recycling) remains within the imposed thickness ranges (typically +/10 microns for a 775 micron wafer). In the context of this second embodiment, greater freedom is provided about the choice of operations that can be done during the recycling treatment. The size and density of COPs in the support substrate only has a limited impact on the quality of the final SeOI substrate. Therefore, it is possible to use substrates with a COP density equivalent to or even greater than the density of COPs in the initial substrate (for example more than 1.5 COP/cm$^2$ or even more than 3 COP/cm$^2$; which for a 300 mm wafer is equivalent to more than 1000 or even 2000 COPs respectively).

One purpose of the processes of the present invention is to reduce the price cost of substrates made by transfer of a thin layer of semiconducting material from a donor substrate to a support substrate, and particularly the price cost of SeOI substrates. More specifically, the present invention is aimed to enable the use of initial substrates formed by cutting an ingot obtained by CZ pulling which is more cost effective than the "Very Slow Pull" type pulling to obtain a near perfect crystal, in a SMARTCUT® type transfer process, while maintaining a crystalline quality of the thin layer compatible with the envisaged applications, without encountering any bonding or recycling type problems caused by use of the previous heat treatment technique mentioned above.

The following gives a list of some preferred but not limitative aspects of such processes:

the forming step of the insulating layer is performed by thermal oxidation of the support substrate;
the forming step of the insulating layer is performed by deposition of an oxide layer on the donor substrate and/or the support substrate;
the curing step is performed immediately after transfer;
the curing step is performed by applying a thermal annealing to the structure obtained after transfer;
the thermal annealing is carried out under a non-oxidizing atmosphere;
the thermal annealing is carried out under an atmosphere containing pure hydrogen, pure argon or a hydrogen/argon mix;
the thermal annealing is a rapid thermal processing (RTP);
the thermal annealing is done in a furnace;
the thermal annealing is a smoothing annealing performed under an atmosphere containing hydrogen and hydrochloric acid;
the donor substrate is a substrate formed by cutting an ingot from the said semiconducting material obtained by pulling creating vacancy clusters with an average size less than the size of clusters present in a near perfect substrate formed by cutting an ingot obtained by slow pulling;
the donor substrate is formed by cutting an ingot obtained by CZ pulling such that the density of clusters of created vacancies larger than 0.14 µm is less than 0.01/cm$^2$;
it comprises a preliminary step to prepare the donor substrate including the following operations;
making an ingot of the said semiconducting material by pulling creating vacancy clusters with an average size less than the size of clusters present in a near perfect substrate formed by cutting an ingot obtained by slow pulling;
and cutting the donor substrate in this ingot;
the donor substrate is formed by cutting an ingot obtained by CZ pulling such that the density of created clusters of vacancies smaller than 0.2 µm is greater than 1.5/cm$^2$;
the donor substrate is formed by cutting an ingot obtained by CZ pulling such that the density of created clusters of vacancies smaller than 0.12 µm is greater than 3/cm$^2$;
the donor substrate is formed by cutting an ingot obtained by a CZ process by pulling at a rate at least 1.2 times greater than the rate of the said slow pulling to obtain a near perfect crystal;
the donor substrate is formed by cutting an ingot subjected to fast cooling;
the donor substrate is a substrate formed by cutting an ingot subjected to nitrogen doping;
it comprises a step consisting of creating a weakness zone within the thickness of the donor substrate without the said donor substrate having been previously submitted to a cleaning treatment;
before the step to create a weakness zone, it includes a step consisting of depositing an oxide layer on the donor substrate surface to form a protection layer, the said protection layer possibly being removed once the weakness zone has been created;
the donor substrate is made of silicon;
the support substrate is obtained in the same way as the donor substrate.

Obviously, this invention is in no way limited to the embodiments described and represented, but those skilled in the art would be capable of adding many variants or modifications.

In particular, for making an SOI substrate, the donor substrate is obviously formed by cutting a silicon ingot.

Furthermore, the invention is not limited to the CZ pulling process, but can be used with any type of ingot pulling process.

Finally, it will be understood that the invention is in no way limited to a given wafer diameter, and is applicable to all wafer diameters.

It should be understood that the above description of the invention and specific examples, while indicating preferred embodiments of the present invention, are given by way of illustration and not limitation. Many changes and modifications within the scope of the present invention may be made without departing from the spirit thereof, and the present invention includes all such changes and modifications.

What is claimed is:

1. A method for forming a semiconductor on insulator structure comprising:
providing a donor substrate having a first density of vacancy clusters, wherein the donor substrate is provided from an ingot of semiconductor material that is pulled at a rate of at least 0.75 mm/min;
providing an insulating layer either on a surface of the donor substrate or on a surface of a support substrate, wherein, when the insulating layer is provided on the donor substrate surface, it is done in a manner to not increase vacancy cluster size;
transferring a thin layer from the donor substrate to the support substrate with the insulating layer provided therebetween; and
curing the transferred thin layer to reduce the first density of vacancy clusters to a second density.

2. The method of claim 1, wherein the insulating layer is provided by thermal oxidizing of the support substrate surface.

3. The method of claim 1, wherein the insulating layer is provided by depositing an oxide layer either on the donor or support substrate surface.

4. The method of claim 1, wherein the curing is performed by applying a thermal annealing to the structure and is performed immediately after transferring the thin layer.

5. The method of claim 4, wherein the thermal annealing is a rapid thermal processing (RTP) performed under a non-oxidizing atmosphere.

6. The method of claim 4, wherein the annealing is performed in a furnace under an atmosphere containing pure hydrogen, pure argon or a mixture of hydrogen and argon.

7. The method of claim 1, wherein the annealing is a smoothing annealing performed under an atmosphere containing hydrogen and hydrochloric acid.

8. The method of claim 1, wherein the ingot has a first density of vacancies larger than 0.14 µm that is less than $0.01/cm^2$ and after curing has a second density of $0.075/cm^2$ or less.

9. The method of claim 1, wherein the ingot has a first density of vacancies smaller than 0.2 µm is greater than $1.5/cm^2$ and after curing has a second density of $0.075/cm^2$ or less.

10. The method of claim 1, wherein the ingot has a first density of vacancies smaller than 0.12 µm is greater than $3/cm^2$ and after curing has a second density of $0.075/cm^2$ or less.

11. The method of claim 1, which further comprises subjecting the ingot to cooling at a sufficiently fast rate to assist in reducing vacancy size and increasing vacancy density.

12. The method of claim 1, which further comprises subjecting the ingot to nitrogen doping at a sufficient rate to assist in reducing vacancy size and increasing vacancy density.

13. A method for forming a semiconductor on insulator structure comprising:
   providing a donor substrate having a first density of vacancy clusters;
   providing a zone weakness in the donor substrate to define the thin layer to be transferred;
   providing an insulating layer either on a surface of the donor substrate or on a surface of a support substrate, wherein, when the insulating layer is provided on the donor substrate surface, it is done in a manner to not increase vacancy cluster size;
   combining the donor wafer, insulating layer and support substrate together;
   transferring a thin layer from the donor substrate to the support substrate with the insulating layer provided therebetween by detaching the donor substrate at the zone of weakness; and
   curing the transferred thin layer to reduce the first density of vacancy clusters to a second density.

14. The method of claim 13, which further comprises providing a protective layer on the donor substrate, implanting atomic species to form the zone of weakness, and optionally removing the protective layer after implanting the atomic species.

15. The method of claim 1, which further comprises detaching an additional thin layer from the donor substrate for forming circuitry therein.

16. The method of claim 1 wherein the support substrate also has the first density of vacancy clusters.

17. A method for forming a semiconductor on insulator structure, comprising:
   nitrogen doping a donor substrate to reduce vacancy clusters therein;
   providing an insulating layer;
   transferring a thin layer of the donor substrate to a support substrate with the insulating layer provided thereon by providing a zone of weakness in the donor substrate to define the thin layer to be transferred and detaching the thin layer from the donor substrate; and
   curing the transferred thin layer to reduce vacancy clusters therein.

18. The method of claim 17 which further comprises:
   forming the insulating layer by depositing an oxide layer on the donor substrate;
   implanting species in the donor substrate through the oxide layer to create the zone of weakness within the donor substrate, so that the oxide layer and thin layer are transferred together to the support substrate.

19. The method of claim 17 which further comprises:
   forming the insulating layer by depositing an oxide layer on the support substrate; and
   transferring the thin layer onto the oxide layer.

20. The method of claim 17 which further comprises forming the insulating layer by thermal oxidation of the support substrate so that the thin layer is transferred onto the insulating layer.

21. The method of claim 17 wherein the nitrogen doping is conducted while pulling the donor substrate from an ingot at a rate that is greater than 0.75 mm/min.

22. A semiconductor on insulator structure comprising an insulating layer located between a thin layer of semiconducting material and a support substrate, wherein the thin layer has a density of vacancy clusters of less than or equal to approximately $0.075/cm^2$ and the support substrate has a density of vacancy clusters greater than or equal to approximately $3/cm^2$.

* * * * *